United States Patent [19]

Kataoka et al.

[11] Patent Number: 5,160,858
[45] Date of Patent: Nov. 3, 1992

[54] FIELD-EFFECT TRANSISTOR CIRCUIT

[75] Inventors: Shigeru Kataoka, Kawasaki; Shoichi Shimizu, Fujisawa, both of Japan

[73] Assignee: Kabushiki Kaisha Toshiba, Kawasaki, Japan

[21] Appl. No.: 774,341

[22] Filed: Oct. 10, 1991

[30] Foreign Application Priority Data

Oct. 11, 1990 [JP] Japan ................................ 2-270555

[51] Int. Cl.⁵ .......................................... H03K 19/20
[52] U.S. Cl. .................................... 307/450; 307/448; 307/296.8; 307/296.5
[58] Field of Search .................... 307/448, 450, 296.5, 307/296.7, 296.8

[56] References Cited

U.S. PATENT DOCUMENTS

| | | | |
|---|---|---|---|
| 4,347,447 | 8/1982 | Proebsting | 307/450 |
| 4,771,189 | 9/1988 | Noufer | 307/450 |
| 4,853,561 | 8/1989 | Gravok | 307/450 |
| 4,970,415 | 11/1990 | Fitzpatrick | 307/296.8 |

FOREIGN PATENT DOCUMENTS 1-157121  6/1989  Japan .

Primary Examiner—Edward P. Westin
Assistant Examiner—Andrew Sanders
Attorney, Agent, or Firm—Finnegan, Henderson, Farabow, Garrett and Dunner

[57]  ABSTRACT

Use of independent current-regulating MES FETs prevents the output terminal potential of a current-regulating MES FET from being fluctuated. This results in no change in the output potential of a DCFL circuit that uses the output terminal potential as its intermediate ground potential, thereby eliminating the malfunction of a subsequent circuit connected to the DCFL circuit, even when another DCFL circuit has carried a large amount of current momentarily, for example, and the output terminal potential of a related current-regulating MES FET becomes unstable to supply as much current as needed to compensate for the drawn current.

5 Claims, 4 Drawing Sheets

FIELD-EFFECT TRANSISTOR CIRCUIT

BACKGROUND OF THE INVENTION

1. Field of the Invention

The present invention relates to a field-effect transistor circuit using a metal semiconductor FET (MES FET) formed on a GaAs (gallium arsenide) substrate and, more particularly, to a current-regulating circuit for supplying current to a cascade connection of direct coupled FET logic (DCFL) circuits.

2. Description of the Related Art

FIG. 1 is a circuit diagram of a DCFL inverter circuit as an example of a DCFL circuit. In general, a DCFL circuit can be operated from a low-voltage power supply of 1 to 2 V, and a constant current is carried through the DCFL circuit regardless of the logical state "0" or "1". For example, in the inverter circuit of FIG. 1, a depletion-type load transistor 51, whose gate and drain are connected to each other, and an enhancement-mode driving transistor 52, whose gate receives the input voltage, are connected in series between the source potential $V_{CC}$ and the ground potential GND. With this inverter circuit, if the source potential $V_{CC}$ is 1 V, then the output potential will be, for example, 0.05 to 0.1 V when the driving transistor 52 is in an on state, whereas it will be, for example, 0.6 to 0.7 V when the transistor 52 is in an off state.

FIG. 2 is a block diagram of another example of a DCFL circuit. As shown in FIG. 2, for example, a circuit which makes use of the aforementioned feature of DCFL circuits and consists of two DCFL circuits cascade-connected (stacked) in two stages to decrease drawn current has been proposed (Japanese patent application No. 63-116422, filed by the assignee of the present invention). In this circuit, a first (the upper) DCFL circuit 11 and a second (the lower) DCFL circuit 12 are cascade-connected between the source potential $V_{CC}$ and ground potential GND. The first DCFL circuit 11 is connected across the drain and source of a current-regulating depletion-type MES FET 13. Specifically, the drain of the MES FET 13 is connected to the source potential $V_{CC}$ and the source thereof is connected to the junction of the upper DCFL circuit 11 and the lower DCFL circuit 12. A bias circuit 14 is connected between the source potential $V_{CC}$ and ground potential GND. In this case, the bias circuit 14 is a potential divider circuit for bisecting the source potential $V_{CC}$, the bisected output of which is applied to the gate of the MES FET 13. When the current flowing through the lower DCFL circuit 12 becomes larger than that flowing through the upper DCFL circuit 11, the MES FET 13 supplies current to the lower DCFL circuit 12 to compensate for the difference in the drawn current between the upper and lower DCFL circuits.

In the circuit of FIG. 2, the lower DCFL circuit 12 is assumed to be a circuit that draws a large amount of current instantaneously like an output circuit. When the lower DCFL circuit 12 has carried a lot of current, the gate-to-source voltage $V_{GS}$ of the MES FET 13 becomes large so as to supply as much current as required to compensate for the drawn current.

However, since the gate potential of the current-regulating MES FET 13 is fixed to the divided constant output of the potential divider circuit 14, the source potential of the MES FET 13 drops. This makes it impossible to maintain the stable potential at the junction of the upper and lower DCFL circuits 11 and 12, i.e., the stable ground potential (the intermediate ground potential $V_{GND1}$) of the upper DCFL circuit 11. This further causes the output potential of the upper DCFL circuit 11 to fluctuate, with the result that a subsequent circuit (not shown) connected to the circuit 11 malfunctions.

In such a conventional current-regulating circuit which supplies compensating current to the cascade-connected DCFL circuits, when a large amount of current are flown through the DCFL circuit to be compensated, the potential at the output terminal of the current-regulating circuit becomes unstable, in order to supply as much current as needed to compensate for the drawn circuit which uses the output terminal of the current-regulating circuit as the intermediate ground potential terminal to fluctuate. This results in the malfunction of a subsequent circuit connected to the DCFL circuit.

SUMMARY OF THE INVENTION

To overcome the aforementioned disadvantages, it is an object of the present invention to provide a field-effect transistor circuit that prevents the output potential of a DCFL circuit from fluctuating due to the unstable intermediate ground potential terminal, which eliminates the malfunctioning of a subsequent circuit connected to the DCFL circuit, even when another DCFL circuit, which is not connected to the former DCFL circuit, has carried a large amount of current momentarily and the output terminal potential of a current-regulating circuit becomes unstable to supply as much current as required to compensate for the drawn current.

The foregoing object is accomplished by providing a field-effect transistor circuit comprising: an output circuit, connected between source potential and ground potential, that is composed of a cascade connection of a plurality of direct coupled FET logic circuits using metal semiconductor FETs; a first current-regulating metal-semiconductor FET, connected between the source potential and a first intermediate ground potential terminal of the logic circuit, for supplying current to the first intermediate ground potential terminal; a bias circuit, connected between the source potential and the ground potential, for supplying a first bias potential to the gate of the first current-regulating FET; and a first stabilizing circuit, connected between the source potential and the ground potential and composed of a series connection of a direct coupled FET logic circuit different from the logic circuit and a second current-regulating metal-semiconductor FET supplying current to the additional direct coupled FET logic circuit with the gate applied with the first bias potential, for stabilizing the first intermediate ground potential of the output circuit.

Use of independent current-regulating MES FETs prevents the output terminal potential of a current-regulating MES FET from being fluctuated. This results in no change in the output potential of a DCFL circuit that uses the output terminal potential as its intermediate ground potential, thereby eliminating the malfunction of a subsequent circuit connected to the DCFL circuit, even when another DCFL circuit has carried a large amount of current momentarily and the output terminal potential of a related current-regulating MES FET becomes unstable to supply as much current as needed to compensate for the drawn current.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of field-effect transistor circuits according to the present invention will be explained in detail with reference to the accompanying drawings.

Figure 1:
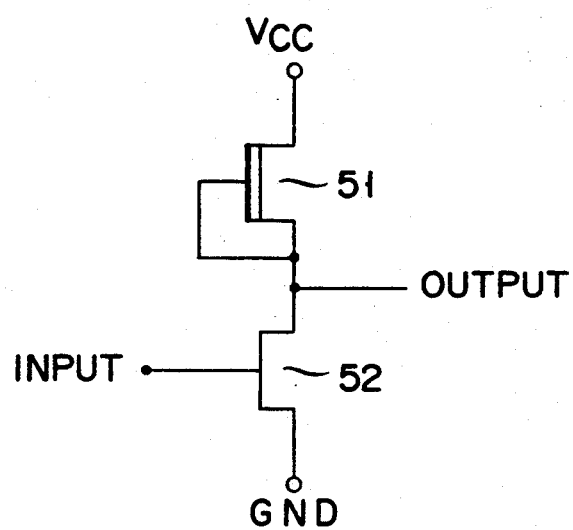
FIG. 1 is a circuit diagram showing a DCFL inverter circuit as an example of a DCFL circuit.
Figure 2:
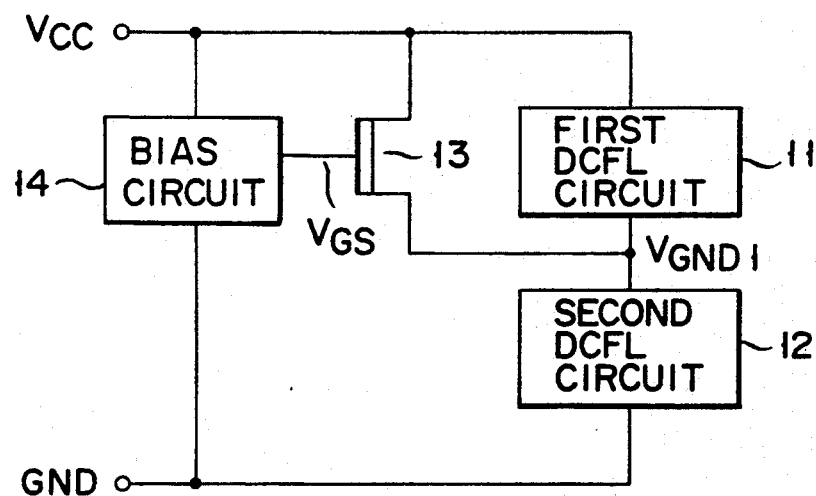
FIG. 2 is a block diagram showing another example of a DCFL circuit.
Figure 3:
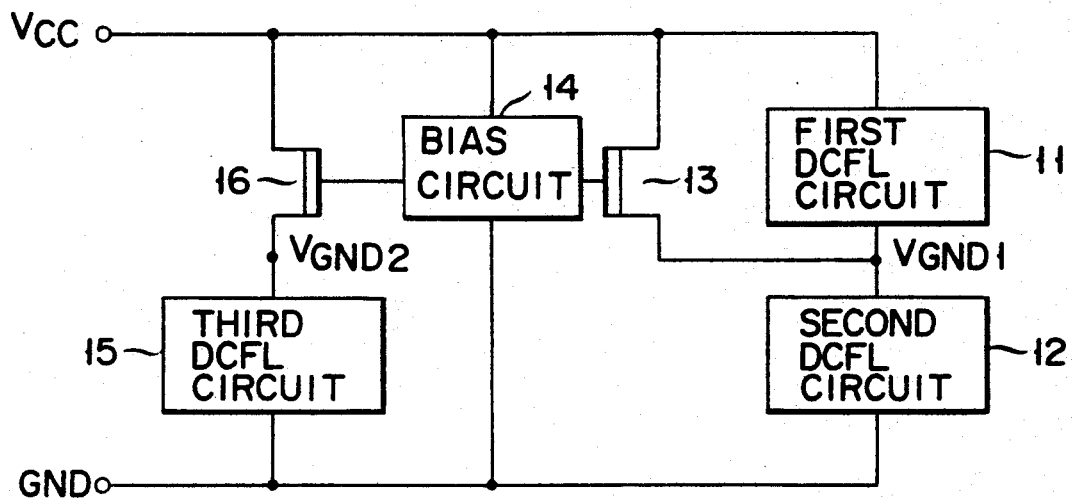
FIG. 3 is a block diagram showing a first embodiment of a field-effect transistor circuit according to the present invention.

FIG. 3 is a block diagram showing a first embodiment of a field-effect transistor circuit according to the present invention. The field-effect transistor circuit of FIG. 3 is the same as the conventional one of FIG. 2 except that the former further contains a third DCFL circuit 15 which is provided separately from the cascade connection of a DCFL circuits 11 and 12, and a current-regulating depletion-type MES FET 16 which is also provided separately from the current-regulating MES FET 13. The same parts as in FIG. 2 are indicated by the same reference numerals. The current-regulating MES FET 16 has a gate applied with the divided voltage from the bias circuit 14, and supplies a current to the third DCFL circuit 15. The drain-to-source path of the MES FET 16 and the additional DCFL circuit 15 are connected in series between the source potential $V_{CC}$ and the ground potential GND.

In such a field-effect transistor circuit of FIG. 3, since two current-regulating MES FETs 13 and 16 are arranged independently, one MES FET 13 dedicated for the DCFL circuits 11 and 12 can be isolated from the other MES FET 16, by allocating an output circuit or the like which possibly carries a lot of current momentarily to the third DCFL circuit 15. With this arrangement, even if the potential $V_{GND2}$ of the output terminal of the MES FET 16 becomes unstable due to an increase of the gate-to-source voltage $V_{GS}$ of the MES FET 16 to supply as much current as required to compensate for the drawn current when the third DCFL circuit 15 has permitted a large amount of current to flow instantaneously, is isolated from the MES FET 16 is not affected by the instability of potential $V_{GND2}$. As a result, the potential $V_{GND1}$ at its output terminal remains unchanged, and the output potential of the DCFL circuit 11 using the unchanged potential as the intermediate ground potential $V_{GND1}$ also remains unchanged. This prevents a subsequent circuit (not shown) connected to the DCFL circuit 11 from being malfunctioned.

Setting the gate width of the MES FET 16 larger for larger current supply capacity decreases a change in the source potential of the third DCFL circuit 15, which improves the rising of the output signal waveform.

Figure 4A:
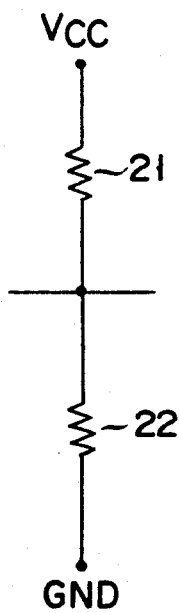
FIGS. 4A through 4C are circuit diagrams showing practical examples of the bias circuit of FIG. 3.
Figure 4B:
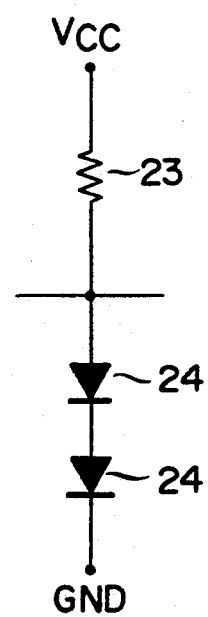
Figure 4C:
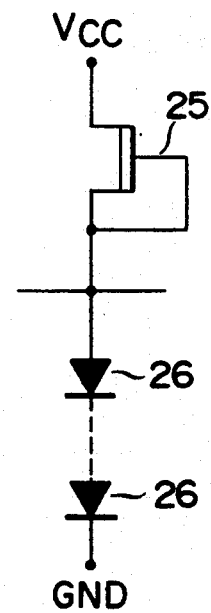

As shown in FIG. 4A, the bias circuit 14 in the embodiment of FIG. 3 may consist of resistors 21 and 22 connected in series between the source potential $V_{CC}$ and the ground potential GND. It may be constructed in other ways such as various series combinations of resistors, diodes, or field-effect transistors connected in diode form. As shown in FIG. 4B, for example, it may be constructed of a series connection of a resistor 23 and two Schottky diodes 24, which provides good temperature characteristics. It may also be made up of a series connection of a depletion-type MES FET (current source) 25 which is connected in diode form and a plurality of Schottky diodes 26, as shown in FIG. 4C, which facilitates manufacturing of the bias circuit 14.

Figure 5:
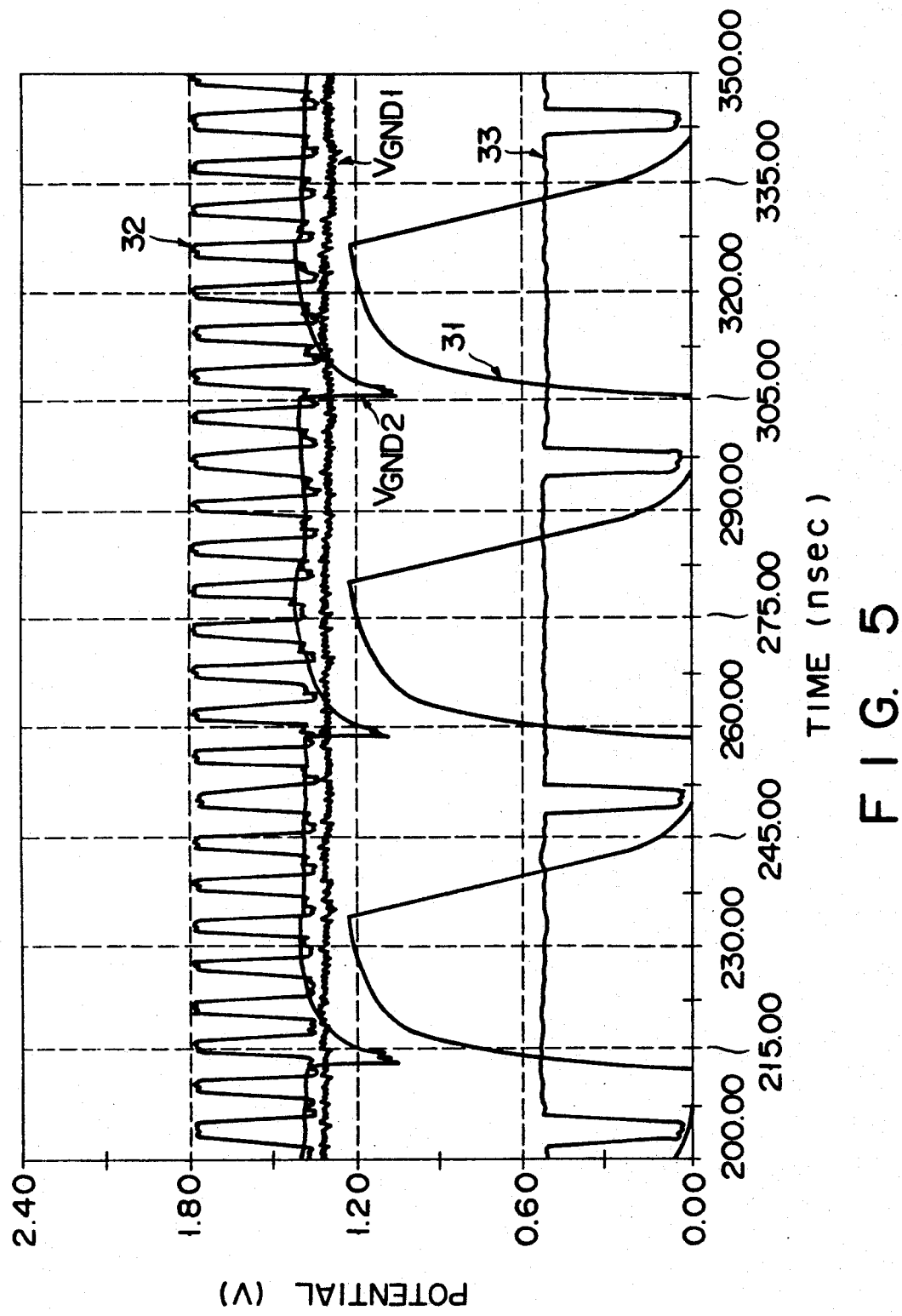
FIG. 5 is a waveform diagram illustrating an example of operating waveforms in the field-effect transistor circuit of FIG. 3.

FIG. 5 is a waveform diagram for illustrating an example of simulation of the operation waveforms of the FET circuit in FIG. 3. Here, it is assumed that the bias circuit 14 is constructed as shown in FIG. 4B, and the source potential $V_{CC}$ is $V_{CC}=3.0$ V. In FIG. 5, reference numeral 31 denotes the output signal waveform of the third DCFL circuit 15; $V_{GND2}$, the potential at the output terminal of the MES FET 16; 32, the output signal waveform of the first DCFL circuit 11; 33, the output signal waveform of the second DCFL circuit 12; and $V_{GND1}$, the potential at the output terminal of the MES FET 13. As seen in FIG. 5, even when the potential $V_{GND2}$ at the output terminal of the MES FET 16 becomes unstable, the potential $V_{GND1}$ at the output terminal of the MES FET 13 remains unchanged. In contrast, in the conventional circuit of FIG. 2, when the potential $V_{GND1}$ at the output terminal of the MES FET 13 becomes unstable, it is impossible to measure the output waveforms 32 and 33.

Figure 6:
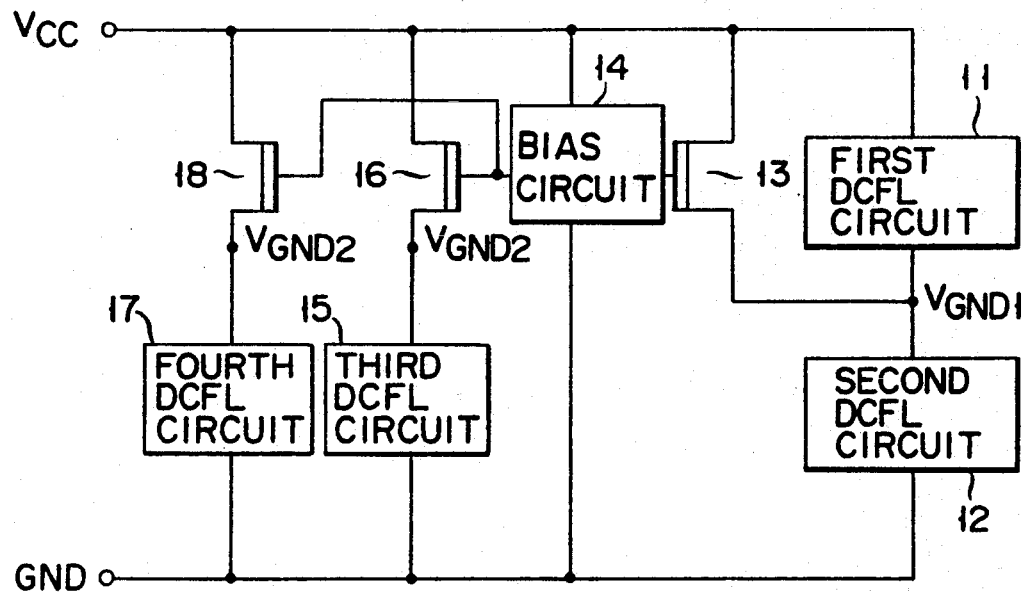
FIG. 6 is a block diagram showing a second embodiment of a field-effect transistor circuit according to the present invention.

FIG. 6 is a block diagram showing a second embodiment of a field-effect transistor according to the present invention. In the first embodiment of FIG. 3, the arrangement is such that a set of the third DCFL circuit 15 and the related current-regulating MES FET 16 is added to the FET circuit of FIG. 2. Similarly, more than one series combination of a DCFL circuit and a current-regulating MES FET may be connected in parallel between the source potential $V_{CC}$ and the ground potential GND. Thus, in FIG. 6, a series combination of a fourth DCFL circuit 17 and a related current-regulating MES FET 18 is connected in parallel with a series combination of the third DCFL circuit 15 and the MES FET 16. This arrangement has the advantage that the output variation of each of the MES FETs 16 and 18 is smaller since two MES FETs 16 and 18 share current variations.

In the above embodiments, the field-effect transistor circuit composed of a cascade connection of two DCFL circuits 11 and 12 and the related MES FET 13 is described. However, another field-effect transistor may be used which is made up of a cascade connection of more than two DCFL circuits and related current-regulating MES FETs.

Figure 7:
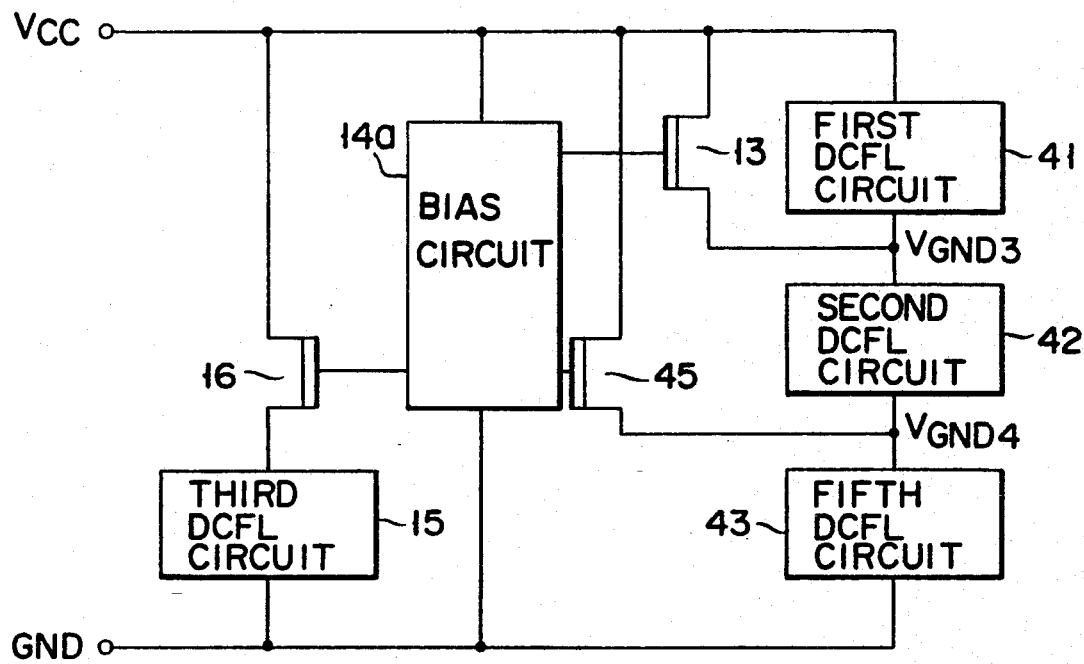
FIG. 7 is a block diagram showing a third embodiment of a field-effect transistor circuit according to the present invention.

FIG. 7 is a block diagram showing a third embodiment of a field-effect transistor according to the present invention. In FIG. 7, a field-effect transistor circuit is shown which contains a cascade connection of three DCFL circuits and related current-regulating MES FETs. The configuration is the same as that of the field-effect transistor circuit of FIG. 3 except that there are current regulating MES FETs 44 and 45 for supplying compensating currents to the corresponding intermediate ground potential points $V_{GND3}$ and $V_{GND4}$, with the bias circuit 14 applying different biases to the gates of the MES FETs 44 and 45. The potential point $V_{GND3}$ is between the first (first stage) and second (second stage) DCFL circuits 41 and 42, and the potential point $V_{GND4}$ is between the second and fifth (third stage) DCFL circuits 42 and 43. The same parts as in FIG. 3 are indicated by the same reference characters. In the third embodiment, the intermediate ground potential $V_{GND4}$ is stabilized by the operation of the MES FET 16. Furthermore, the difference in the drawn current between the second DCFL circuit 42 and the fifth DCFL circuit 43 is compensated for by the MES FET 45, whereas the drawn current difference between the first DCFL circuit 41 and the second DCFL circuit 42 is compensated for by the MES FET 44. This further stabilizes the ground point potentials $V_{GND3}$ and $V_{GND4}$.

Although in the above embodiments, a potential divider circuit that divides the source voltage between the source potential $V_{CC}$ and the ground potential GND is used as the bias circuit 14, other bias circuits may be used as long as they apply bias potentials to the gates of the current-regulating MES FETs 13, 16, 18, 44 and 45.

As described above, with field-effect transistors according to the present invention, even if the output terminal potential of a current regulating circuit becomes unstable to supply as much current as required to compensate for the drawn current when a DCFL circuit has carried a large amount of current momentarily, it is possible to prevent the output potential of another DCFL circuit not connected to the former DCFL circuit from fluctuating due to instability at the intermediate ground potential terminal of the latter DCFL circuit. This eliminates the malfunction of a subsequent circuit connected to the latter.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A field-effect transistor circuit comprising:
an output circuit, connected between source potential and ground potential, that is composed of a cascade connection of a plurality of direct coupled FET logic circuits using metal semiconductor FETs;
a first current-regulating metal-semiconductor FET, connected between said source potential and a first intermediate ground potential terminal of said output circuit, for supplying current to a first intermediate ground potential terminal;
a bias circuit, connected between said source potential and said ground potential, for supplying a first bias potential to the gate of said first current-regulating FET; and
a first stabilizing circuit, connected between said source potential and said ground potential and composed of a series connection of an additional direct coupled FET logic circuit different from said plurality of direct FET logic circuits and a second current-regulating metal-semiconductor FET supplying current to said additional direct coupled FET logic circuit with the gate applied with said first bias potential, for stabilizing said first intermediate ground potential of said output circuit.

2. A circuit according to claim 1, wherein said bias circuit is a potential divider circuit that divides the source voltage between said source potential and said ground potential.

3. A circuit according to claim 2, wherein said potential divider circuit is composed of a series connection of a plurality of resistors, diodes, or field-effect transistors connected in diode form, and connected between said source potential and ground potential.

4. A circuit according to claim 1, further comprising a second stabilizing circuit provided in parallel with said first stabilizing circuit between said source potential and said ground potential.

5. A circuit according to claim 1, further comprising a third current-regulating metal semiconductor FET, connected between said source potential and a second intermediate ground potential terminal of said logic circuit, for supplying current to the second intermediate ground potential terminal.

* * * * *

UNITED STATES PATENT AND TRADEMARK OFFICE
CERTIFICATE OF CORRECTION

PATENT NO. : 5,160,858

DATED : November 03, 1992

INVENTOR(S) : Shigeru Kataoka et al.

It is certified that error appears in the above-identified patent and that said Letters Patent is hereby corrected as shown below:

Claim 1, column 6, line 25, after "direct" insert
--coupled--.

Signed and Sealed this

Twenty-second Day of February, 1994

Attest:

BRUCE LEHMAN

*Attesting Officer*   *Commissioner of Patents and Trademarks*